United States Patent
Sundstrom

Patent Number: 5,864,177
Date of Patent: Jan. 26, 1999

[54] BYPASS CAPACITORS FOR CHIP AND WIRE CIRCUIT ASSEMBLY

[75] Inventor: Lance L. Sundstrom, Pinellas Park, Fla.

[73] Assignee: Honeywell Inc., Minneapolis, Minn.

[21] Appl. No.: 764,371

[22] Filed: Dec. 12, 1996

[51] Int. Cl.$^6$ ..................................... H01L 23/34
[52] U.S. Cl. ................ 257/723; 257/724; 257/777; 257/306; 257/532
[58] Field of Search ....................... 257/777, 782, 257/783, 306, 307, 308, 924, 532, 723, 724; 361/306.2, 306.3, 306.1, 308.01, 301.02; 438/261, 238, 329, 109, 110, 107

[56] References Cited

U.S. PATENT DOCUMENTS

| | | | |
|---|---|---|---|
| 5,281,846 | 1/1994 | Kaiser | 257/532 |
| 5,377,072 | 12/1994 | Sparkman et al. | 257/532 |
| 5,528,083 | 6/1996 | Malladi et al. | 257/924 |

*Primary Examiner*—Mahshid D. Saadat
*Assistant Examiner*—S. V. Clark
*Attorney, Agent, or Firm*—Robert E. Greenstien

[57] ABSTRACT

Stacked die that are separated by an overlaying chip capacitor with a plate bonded to the bottom of the top die with a conductive adhesive and the capacitor shell bonded to the top of the lower die with a non-conductive adhesive. The lower die is attached to a substrate using a conductive adhesive. Conductors extend from edge terminals on the substrate to edge terminals on the lower die, and conductors extend from the lower die terminals to the capacitor that are tiered to provide space between the die for the wires and connections. A second overlaying capacitor is attached to the top of the upper die with non-conducive adhesive. Pads on the capacitor are connected by conductors to edge pads on the die and conductors extend from the pads to pads on the substrate.

11 Claims, 3 Drawing Sheets

BYPASS CAPACITORS FOR CHIP AND WIRE CIRCUIT ASSEMBLY

TECHNICAL FIELD OF THE INVENTION

This invention relates bypass capacitors designed for chip-level assembly (chip and wire), in particular, stacked die.

BACKGROUND OF THE INVENTION

As the need to provide sophisticated circuitry in smaller packages grows, techniques such as "die stacking" are becoming increasing popular. With one method of die stacking, the die are separated by a spacer comprised of an insulating material, such as silicon aluminum nitride or alumina to provide clearance for the wire bond connections made between the bond pads at the top periphery of the die and and the mating bond pads of the supporting substrate.

Bypass capacitors are used in large and small circuits to provide local decoupling of the supply voltages around active circuitry. Placing bypass capacitors as close as possible to the active circuitry and minimizing the length of the power and ground connections between the bypass capacitors and the active circuitry optimizes power supply stabilization and noise suppression.

Optimal installation of bypass capacitors with sufficient capacitance is problematic in planar multichip assemblies to begin with, but is even more difficult with stacked die owing to the lengthening of the bond wires from the die to the substrate and higher active circuit densities. This is evidenced in FIGS. 4 and 5, which demonstrate an approach where bypass capacitors are attached on a mini-substrate that is attached to the top of the stack, a notable characteristic being that all the bypass currents flow through long bond wires 78, 80 (relative to the size of the circuit) because the capacitors 78 are at the top of the stack. Thus, when a bypass capacitor provides current to the bottom die 76 (when there is temporary drop in the supply voltage to the circuit), the stabilized current from the capacitor 70 flows through the connection 78 and then up through connection 80. The connection lengths are small compared to normal large circuits, but their impedances can have a significant effect under high current transients (di/dt) caused by the active circuitry.

DISCLOSURE OF THE INVENTION

An object of the present invention is to integrate die bypass capacitance, spacer and backside connection functions into a single structure.

According to the invention, stacked die ("chips") in a multichip module are separated by stack caps sized to fit within the area inside the eripheral bond pads of the die. The bottom die is attached to the supporting substrate with a conductive adhesive and the stack cap for that die is attached to the top of the bottom die with a non-conductive adhesive. The bottom die and stack cap are then wire bonded. The power and ground bond wires are stitch bonded to the stack cap, the die and the supporting substrate. The next die (stacked above) is attached to the top of the bottom stack cap a conductive adhesive to provide an electrical connection through the stack cap and bond wires to the substrate. The second stack cap is attached with non-conductive adhesive on top of the second die and wire bond connections are made between the second stack cap, the second die and the substrate.

According to the invention, metalizaton on the "steps" of the tiered periphery provide the terminations of the stack cap, creating continuous termination rings that accommodate any pattern of power and ground bond wire connections to the die.

According to the invention, the top of the stack cap is metalized and electrically connected to one of the termination rings to provide connections to the backside of the die above.

A feature of the invention is that the very short wire connections (between each die and its stack cap) have very low equivalent series resistance and inductance. Another feature is that the invention provides a significant reduction in the size (volume) and weight of the integrated circuit by eliminating the need for standard chip capacitors at the top or around the periphery of each die stack. The invention can be used in most single and multichip modules. The stack cap fits within the wire bond pads at the periphery of the die, and the "tiered" continuous termination ring on the periphery of the stack cap accomodates any pattern of wire bond interconnections between the stack cap, the die and the substrate, provides vertical separation between the supply bond wires of the stack cap, and provides wire bond clearance for sequential stacking and bonding of additional die and stack caps. The consequent "3-D" assembly of the die and stack caps increases circuit densities as compared to conventional planar assemblies using standard chip capacitors.

Other objects, benefits and features of the invention will be apparent from the following discussion of one or more embodiments.

BEST MODE FOR CARRYING OUT THE INVENTION

Figure 2:
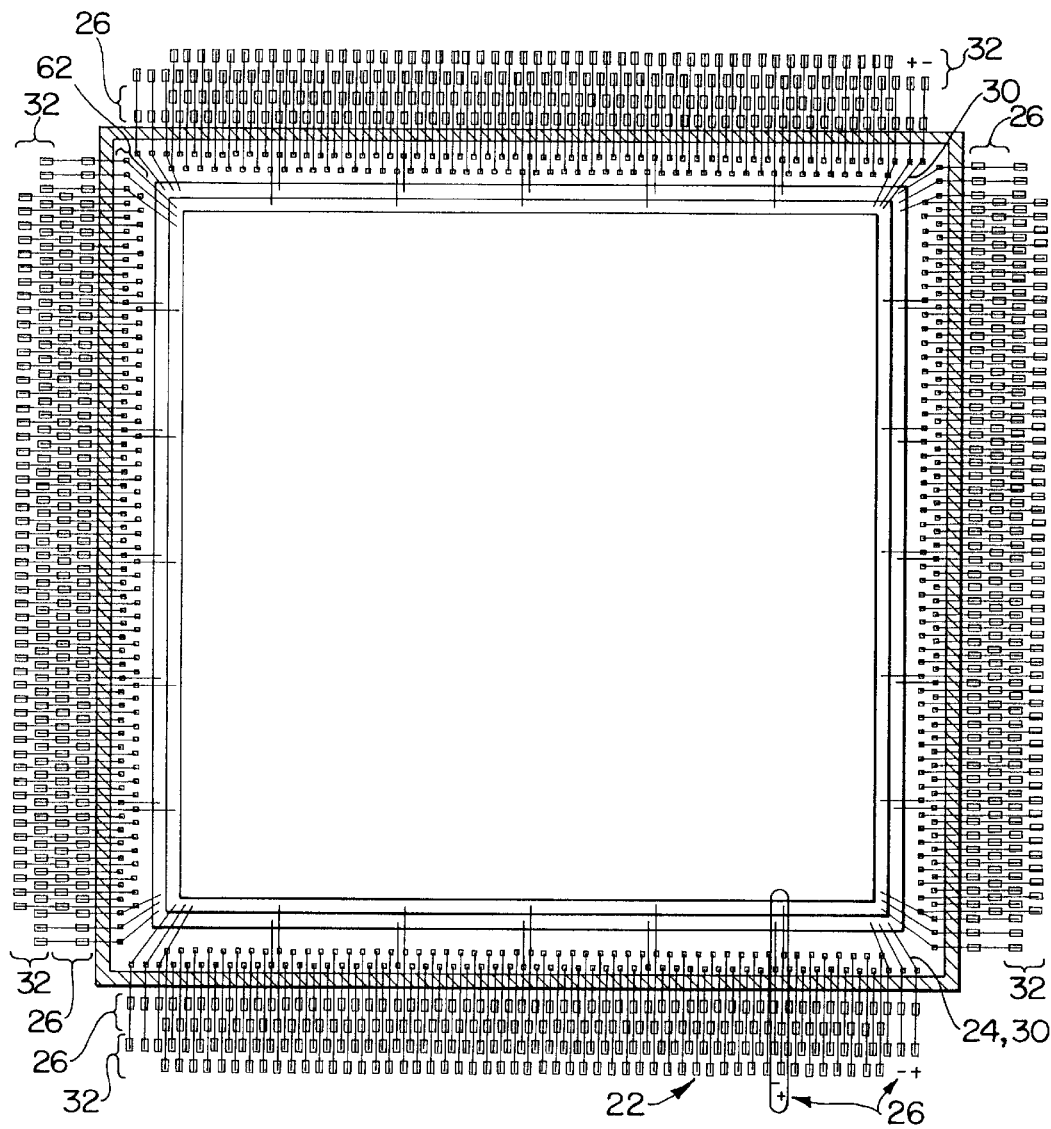
FIG. 2 is a plan view of the circuit shown in FIG. 1.
Figure 1:
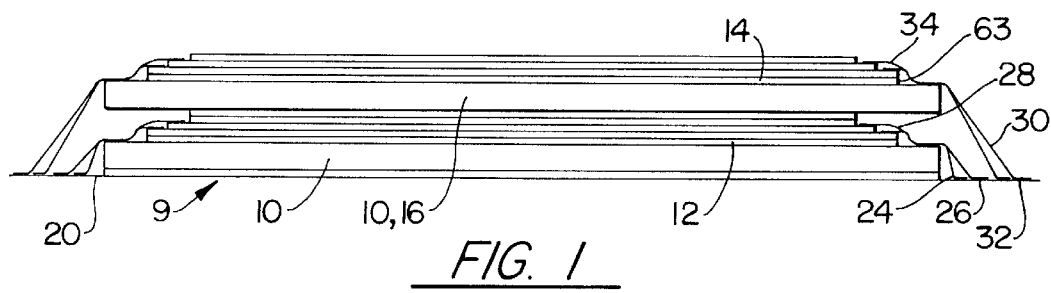
FIG. 1 is an elevation of a dual die stack with stack caps according to the present invention.

Referring to FIG. 1, a die stack 9 contains two die 10, 16 and two interleaved stack caps 12, 14 that provide voltage by-pass stabilization to the die 10, 16. The die stack 9 is bonded to the substrate 20. Typical of conventional integrated and multichip circuits, a plurality of signal and power supply bond pads 22 (shown in detail in FIG. 2) are arranged around the die stack on the substrate 20 for wire bonding the mating die bond pads and stack cap termination rings of the die stack. Bond wires 24 connect positive and negative bond pads 26 on the substrate 22 to respective positive and negative bond pads 46 on the die 10 and the bond rings 28 on the capacitor 12, which is shown in more detail in FIG. 3. The top capacitor 14 provides voltage by-pass stabilization to the top die 16 through the conductors 30 that connect the positive and negative terminals 62 of the top die 16 to the positive and negative terminals 32 on the substrate 20 and the positive and negative terminals 34 on the capacitor 14 . As compared to FIG. 3, multiple electrical connections between the capacitor terminations 28, 34, the die terminations 46, 62 and the terminals 26 and 42 are shown in FIG. 2 to illustrate a preference to electrically connect the die 10, 16 and the capacitors 12, 14 and the substrate 20 with minimal impedance, for optimum voltage stabilization. This distributes the current load, provides more efficient performance by the bypass capacitors relative to the entire circuit and reduces the impedance of current paths for current supplied by the capacitors to the die.

Figure 3:
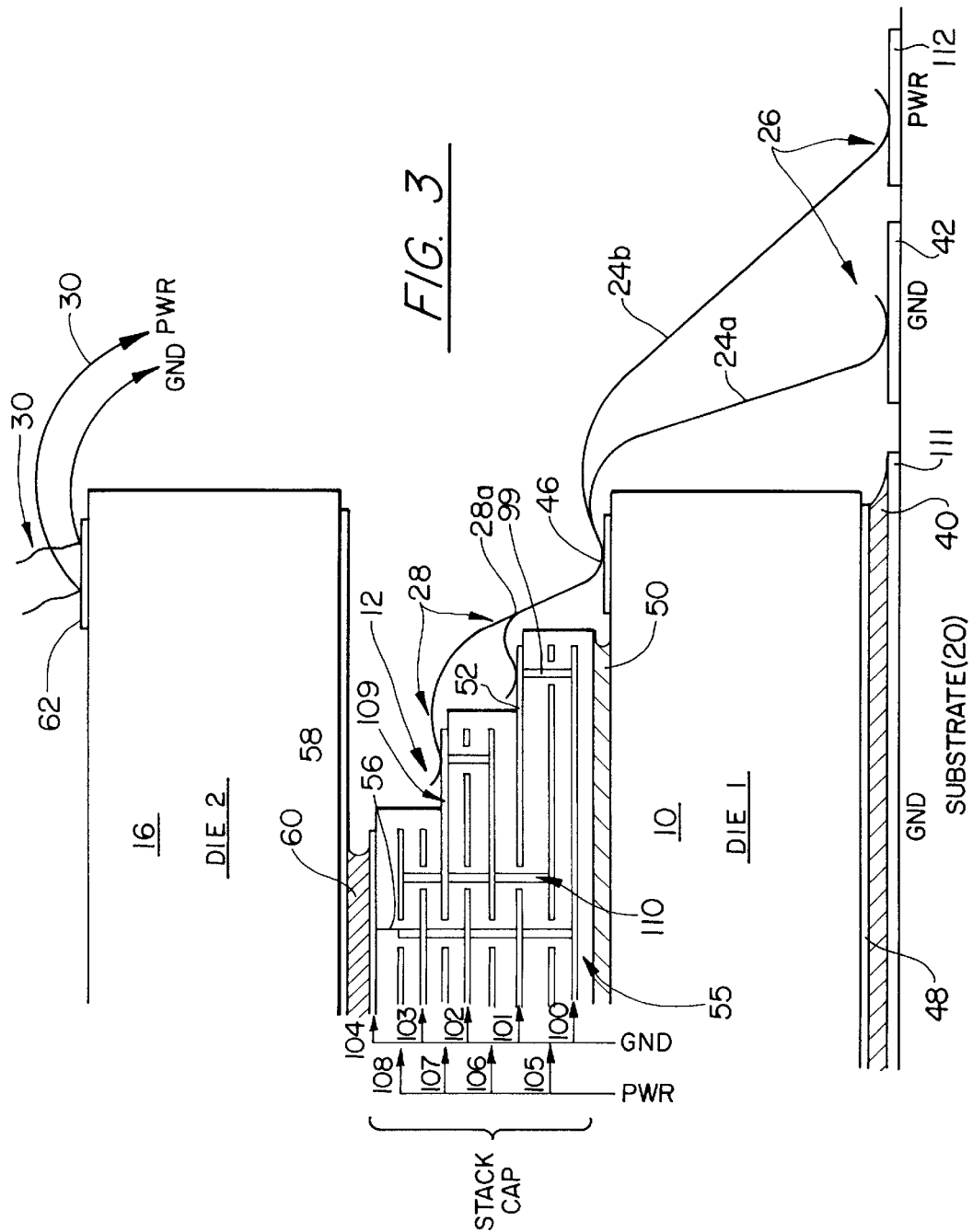
FIG. 3, an enlarged, enhanced elevation of a portion of FIG. 1, includes an example of a stack cap between the two die and details the internal planes and vias.

FIG. 3 shows that the back side metalization 48 of the bottom die 10 is attached to and electrically connected to the substrate 20 by a conductive adhesive 40, such as Ablestick 84-1LMI brand adhesive. For illustrative purposes, the die attach pad 111 on the substrate 40 is at ground potential (GND) and the wire bond terminal 42 likewise is a ground potential. The polarities of the backside connection can be reversed or can float (left unconnected). FIG. 3 illustrates that two wires 24a, 24b connect ground and power substrate terminals 42, 112, (number 26 in FIG. 1) to corresponding ground and power die terminals (die pads) 46 on the top of the bottom die 10 and to positive (PWR) and negative (GND) terminations 52, 109 on the bottom capacitor 12. The bottom capacitor 12 is attached to the top of the bottom die 10 with a non-conductive adhesive 50, such as Ablestick 984-4 brand adhesive. Wire 24a connects one of the capacitor bond rings 52 with the die ground pad 46 and substrate gound pad 42. The top bond pad 58, bottom bond ring 52 and internal planes or plates 100–103 are connected together with multiple vias, such as vias 99. The top bond ring 109 is connected to internal planes with multiple, such as vias 110. The dielectric 55 of the bottom capacitor 12 is bonded to the top of the bottom die 10 with the conductive adhesive 50. The die attach pad 111 on the substrate 20 and the power and ground planes of the stack caps 12, 14 form an EMI shield around the active circuitry of the die 10, 16. The conductors 30 electrically connect the pads 62 on the top of the die 16 to the substrate pads 32 and to the respective positive and negative capacitor bond rings on the top capacitor 14, which is attached to the top of the die 16 with the non-conductive adhesive 50.

Figure 5:
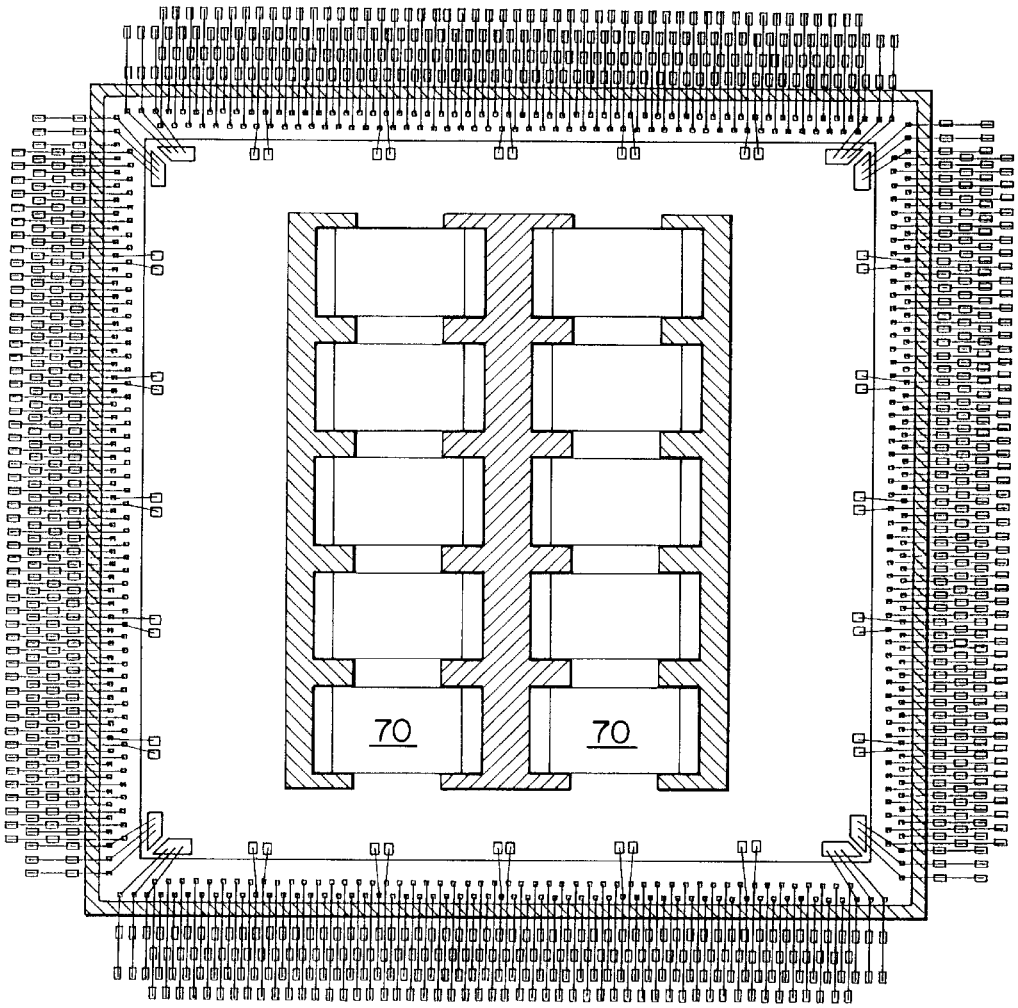
FIG. 5 is a plan view of the circuit shown in FIG. 4.
Figure 4:
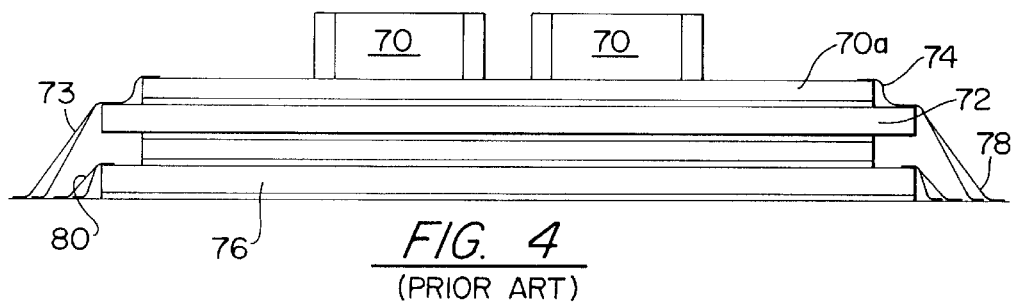
FIG. 4 is an elevation of a dual die stack with a plain spacer spacer between the die, a mini substrate and stardard bypass capacitor at the top of the spacer.

Each capacitor 12 and 14 can supply bypass voltage to its respective die through the comparatively short portions of conductors 26 and 30. This should be contrasted with another approach, previously described and shown in FIGS. 4 & 5, where the capacitors 70 are bonded to mini-substrate 70a at the top of the upper die 72. While that configuration provides short bond wire lengths 74 (top portion of bond wires 78) to the upper die 16, current flow from the capacitors 70 to the lower die 76 flows down bond wires 78 and then back up through bond wires 80, which is a much longer path. Moreover, that configuration does not take advantage of the capacitor plates to provide an efficient ground plane and EMI shielding.

Although the present invention has been described with reference to preferred embodiments one of ordinary skill in the art will be able to make modifications and changes, in addition to any already described, in whole or in part to the components and devices described above to carry out the invention without departing from the spirit and scope of the invention.

I claim:

1. A circuit characterized by:

a substrate;

a first die bonded to the substrate with a first adhesive;

a capacitor bonded to the top of the first die with a second adhesive;

a second die bonded to the top of the capacitor with the first adhesive;

and a conductor extending from said substrate to the first die and one terminal on the capacitor.

2. The circuit described in claim 1, further characterized in that:

the first adhesive is conductive.

3. The circuit described in claim 1, further characterized in that:

the second adhesive is non-conductive.

4. The circuit described in claim 1, further characterized by:

a stitch bond for attaching the first die with the conductor.

5. The circuit described in claim 1, further characterized by:

stacked terminals on the capacitor that are horizontally offset from each other.

6. The circuit described in claim 1, further characterized by:

stitch bonded wires connecting power and ground pads of the substrate with the first and second die and the capacitor.

7. The circuit described in claim 1, further characterized by:

continuous peripheral bond ring terminals on the capacitor that are offset vertically from each for providing bond wire clearance between the die.

8. The circuit described in claim 1, further characterized in that:

the capacitor overlays the top the first die.

9. A method of assembling a circuit on a substrate, characterized by:

bonding a first die to a substrate using a first adhesive;

bonding a capacitor on the top of the first die using a second adhesive;

bonding a second die to the top of the capacitor using the first adhesive; and extending a conductor from said substrate to the first die and one terminal on the capacitor.

10. The method described in claim 9, further characterized by:

forming capacitor terminals along the edge of the capacitor with adjacent vertically disposed terminals being horizontally offset.

11. A circuit comprising stacked die, characterized by:

first bypass means for maintaining DC voltage to one of the die, second bypass means for maintaining DC voltage to a second of the die;

said first bypass means being located between to the top of the first die and the bottom of the second and electrically connected to power supply pads on the top of the first die;

the second bypass means being located on top of the second die and electrically connected to power supply pads on the top of the first die;

an adhesive for bonding to first bypass means to the first and second die; and an adhesive for bonding the second bypass means to the top of the second die.

* * * * *